United States Patent
Kanda et al.

(10) Patent No.: US 7,397,293 B2
(45) Date of Patent: Jul. 8, 2008

(54) CLOCK DISTRIBUTION CIRCUIT

(75) Inventors: Kouichi Kanda, Kawasaki (JP);
Hirotaka Tamura, Kawasaki (JP);
Hisakatsu Yamaguchi, Kawasaki (JP);
Junji Ogawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/392,632

(22) Filed: Mar. 30, 2006

(65) Prior Publication Data

US 2007/0063751 A1 Mar. 22, 2007

(30) Foreign Application Priority Data

Sep. 16, 2005 (JP) .............................. 2005-271206

(51) Int. Cl.
*G06F 1/04* (2006.01)
(52) U.S. Cl. ....................... 327/291; 327/563
(58) Field of Classification Search ........................ None
See application file for complete search history.

(56) References Cited

U.S. PATENT DOCUMENTS

| | | |
|---|---|---|
| 5,136,357 A | 8/1992 | Hesson et al. |
| 6,037,807 A * | 3/2000 | Wu et al. ....................... 327/52 |
| 6,597,303 B2 * | 7/2003 | Cosand ........................ 341/165 |
| 6,653,892 B2 * | 11/2003 | Park ............................ 327/563 |
| 6,842,136 B1 | 1/2005 | Agarwal et al. |
| 6,954,103 B2 * | 10/2005 | Yamauchi et al. ........... 327/540 |
| 2005/0035789 A1 | 2/2005 | Tamura et al. |

FOREIGN PATENT DOCUMENTS

| | | |
|---|---|---|
| JP | 07-161185 A | 6/1995 |
| JP | 3265181 B2 | 12/2001 |
| JP | 2004-317910 A | 11/2004 |

* cited by examiner

*Primary Examiner*—Cassandra Cox
(74) *Attorney, Agent, or Firm*—Arent Fox LLP

(57) ABSTRACT

A clock distribution circuit for suitably generating, transmitting, and receiving clock signals used in circuits that are configured with the same circuit topology is provided. The clock distribution circuit has a transmission buffer circuit that transmits a clock signal and an amplitude amplification buffer circuit that amplifies the amplitude of cross-coupling connections inserted in parallel with the transmission buffer circuit on a transmission path for the clock signal. Wherein the number of transistors having the same conductivity type as the transistors of a differing conductivity type of the transmission buffer circuit and that of the transistors of a differing conductivity type of the amplitude amplification buffer circuit are the same. At least one transistor is provided as a bias adjustment transistor for adjusting bias in each of the transmission buffer circuit and the amplitude amplification buffer circuit, respectively, and bias adjustments are made simultaneously.

12 Claims, 7 Drawing Sheets

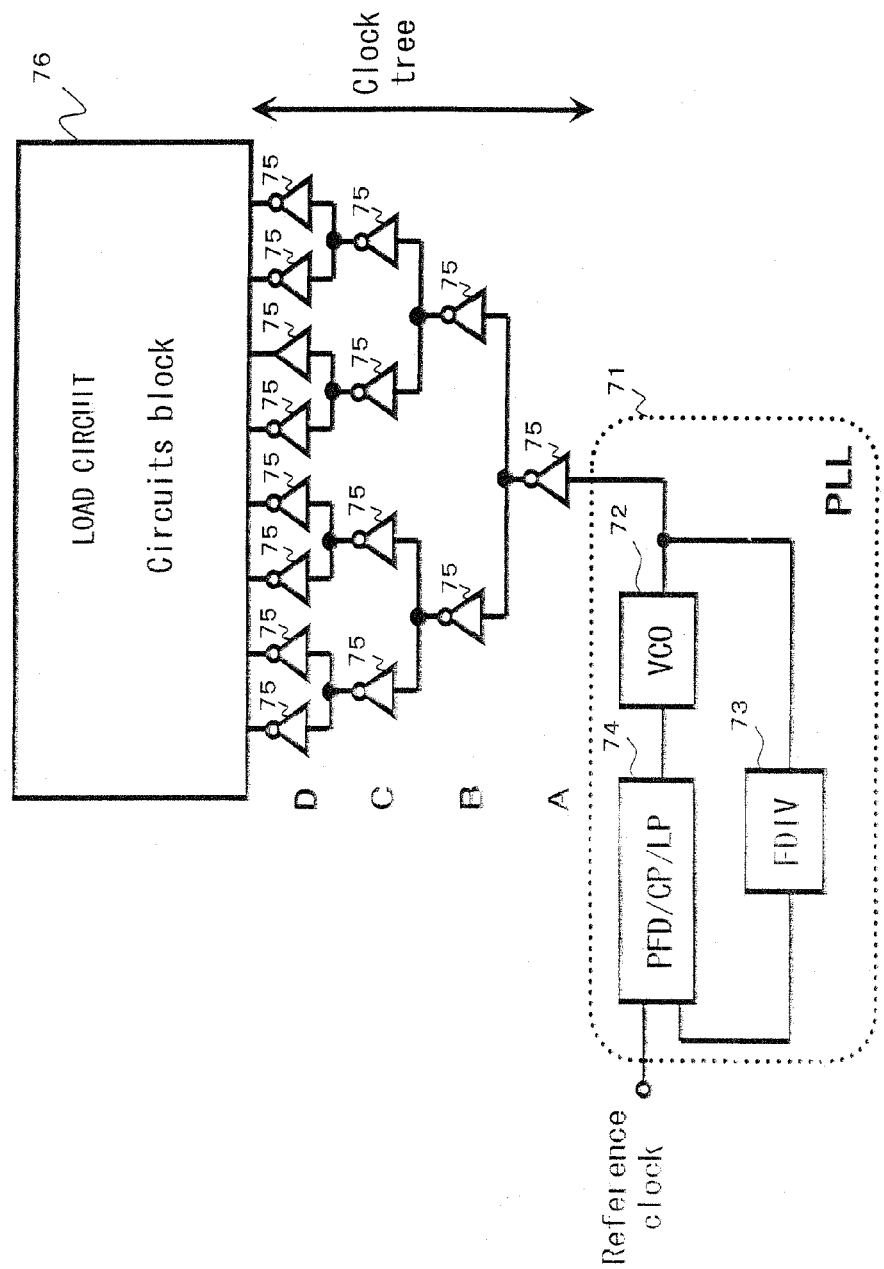
F I G. 1

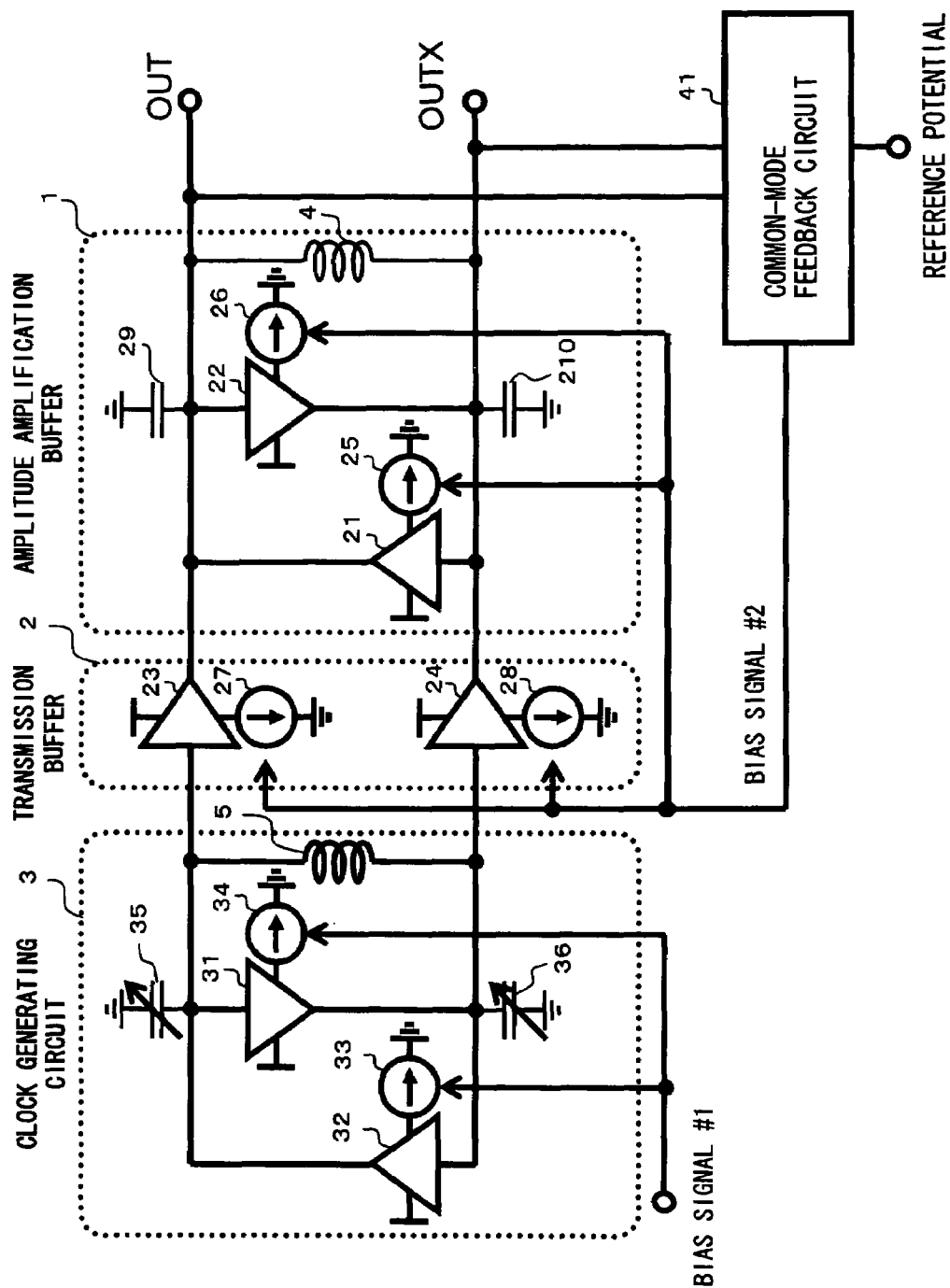
F I G. 5

CLOCK DISTRIBUTION CIRCUIT

CROSS-REFERENCE TO RELATED APPLICATIONS

This application is based upon and claims the benefit of priority from the prior Japanese Patent Application No. 2005-271206 filed on Sep. 16, 2005, the entire contents of which are incorporated herein by reference.

BACKGROUND OF THE INVENTION

1. Field of the Invention

The present invention relates to a circuit which generates and distributes high-speed and high-accuracy clock signals for analog circuits and digital circuits. In particular, the present invention relates to a technology for a high-speed interface circuit, a processor, and a clock distribution circuit that requires high-frequency clock signals.

2. Description of the Related Art

Conventionally, multiple-stage buffer transmission is the most commonly employed clock signal distribution method wherein transmission is performed by connecting buffers in multiple stages. The multiple-stage buffer transmission method is widely used to provide clock signals with the desired amplitude and common-mode voltage to a circuit requiring clock signals under various process conditions.

FIG. 1 shows an example of a conventional clock signal distribution configuration. In the example configuration, a clock signal with relatively large amplitude, generated in a VCO (voltage-controlled oscillator) 72 within a PLL (phase-locked loop) 71 is transmitted to a circuit 76 through inverters 75 in a clock tree. The PLL 71 comprises a block to which a reference clock signal and a reproduction clock signal are input and the corresponding phase and frequency are detected., a block for comparing the results thereof, and a PFD/CP/LP circuit 74 having a loop filter for generating VCO control voltage and the like. The PLL 71 further comprises an N divider 73. The clock signal generated in the PLL 71 is provided to a plurality of inverters 75 in the next stage (B-stage) via a CMOS (complementary metal-oxide semiconductor) inverter 75 (A-stage). The attributes of each inverter 75 in the B-stage are mutually equal and the lengths of wiring to each inverter 75 are also mutually equal. The output clock signal output, wherein the signal is converted to normal rotation by the inverters 75 in B-stage and outputted, is configured to be mutually equal to the gate delay time. In addition, the output clock signal output is also configured to be mutually equal to the gate delay time in the path of the output clock signal in the C-stage and D-stage.

Therefore, the output clock signals are outputted respectively from each inverter 75 to the corresponding output terminal. The differences in the timing of clock skew of the output clock signals are suppressed and the phases of the output clock signals match each other. Subsequently, the signals are provided to each output clock signal load circuit 76.

However, the load capacity which can be driven by a single inverter 75 is limited, and therefore clock signals are handled by the clock distribution circuit and the like according to the load capacity to provide with clock signals in integrated circuits which perform digital signal processing by clock synchronization and the like. Although not shown, in order to increase the number of outputs in clock distribution circuits such as this, three inverters are further provided respectively in the latter stage of the inverter, and in addition, corresponding inverters for phase adjustment are provided in the earlier stage or the latter stage. In this way, a method for outputting a lot of clock signals with reduced clock skew to the load circuit 76 respectively is proposed.

Japanese Patent Publication No. 7-161185 describes, a proposal is made for realizing high-speed data transmission with low power consumption when the input of the receiver circuit only changes slowly and the operation speed becomes slow when the wiring for data transmission becomes long in a data transmission circuit.

In addition, according to Japanese Patent Publication No. 2004-317910, a signal transmission circuit in a liquid crystal display device which enables high-speed signal transmission without increasing wiring area or power consumption even when the wiring has a high resistance, such as aluminum wiring on a glass substrate, is proposed.

According to Japanese Patent Publication No. 3265181, a clock distribution circuit which reduces clock skew attributed to fluctuations in the transmission delay time of a clock signal due to wiring and reduces internal delay of the clock signal attributed to increase in wiring resistance due to miniaturization of the process, even when the wiring lengths are the same, is proposed.

However, there is a problem in that the number of stages in the clock tree increases and the internal delay of the clock signal within the integrated circuit 76 increases with the increase in the circuit size of the integrated circuit 76 to which the clock signal is input, and the circuit becomes unsuitable for high-speed operations.

In addition, in conventional circuits using multiple-stage inverters, buffers, etc, the signals do not reach full amplitude during transmission due to insufficient bandwidth in the transmission circuit and the like. Therefore, there is a problem in that the common-mode voltage of the clock signal is not stable.

In addition, with regards to voltage and amplitude, it is necessary to consider: 1) the output voltage amplitude and common-mode voltage of the circuit generating the clock signal (in this case, VCO); 2) the voltage amplitude and common-mode voltage facilitating transmission in the circuit transmitting the clock signal; and 3) the voltage amplitude and common-mode voltage desired by the circuit receiving the clock signal.

Thus, because the operating speeds of the clock generating circuit and the circuit receiving the clock signal increase when the frequency of the clock signal increases, the accuracy of the operation timing of the circuit must be increased. Thus, although the importance of fulfilling the three conditions above increases, the distribution of the clock signal becomes more difficult due to insufficient bandwidth in the circuit. In addition, according to Patent References 1 to 3, the foregoing issues are not resolved by configuring the clock distribution circuit with the same transistor (such as MOSFET) configuration (topology).

SUMMARY OF THE INVENTION

The present invention provides a clock distribution circuit for suitably generating, transmitting, and receiving clock signals used in circuits that are configured with the same circuit topology.

According to one aspect of the present invention, the clock distribution circuit has a transmission buffer circuit that transmits a clock signal and an amplitude amplification buffer circuit that amplifies the amplitude of cross-coupling connections inserted in parallel with the transmission buffer circuit on a transmission path for the clock signal. And the same number of transistors with the same conductivity type are provided respectively to the transmission buffer circuit comprising the transistors of a differing conductivity type and the amplitude amplification buffer circuit comprising the transistors of a differing conductivity type, at least one transistor is provided as a bias adjustment transistor in the transmission buffer circuit and the amplitude amplification buffer circuit, respectively, and bias adjustments are made simultaneously.

With this configuration, the amplitude of the clock signal during transmission can be secured and the common-mode voltage can be stably supplied.

According to one aspect of the present invention, the clock distribution circuit has a transmission buffer circuit for the transmission of a clock signal and an amplitude amplification buffer circuit for the amplitude amplification of cross-coupling connections inserted in parallel with the transmission buffer circuit on a transmission path providing clock signals from a clock generating circuit for generating a clock signal, wherein the same number of transistors with the same conductivity type are provided respectively to the clock generating circuit comprising the transistors of a differing conductivity type, the transmission buffer circuit comprising the transistors of a differing conductivity type, and the amplitude amplification buffer circuit comprising the transistors of a differing conductivity type, at least one bias adjustment transistor is provided in the clock generating circuit, the transmission buffer circuit, and the amplitude amplification buffer circuit, respectively, a first bias signal for performing bias adjustments in the clock generating circuit and a second bias signal for performing bias adjustments in the transmission buffer circuit and the amplitude amplification buffer circuit are provided separately, and bias adjustments are made simultaneously.

Preferably, the clock generating circuit has an inductance between the output terminals.

In addition, the clock generating circuit connects a capacitance between a first output terminal and the ground and between a second output terminal and the ground, respectively.

In addition, preferably, the amplitude amplification buffer circuit has an inductance between the output terminals.

In addition, the amplitude amplification buffer connects a capacitance between a first output terminal and the ground and between a second output terminal and the ground, respectively.

In addition, the bias adjustment transistor makes adjustments based on the potential of the output of the amplitude amplification buffer circuit.

In addition, the first bias signal makes adjustments based on the potential of the output from a circuit that is provided separately from the clock generating circuit and that circuit is similar to the clock generating circuit.

The second bias signal makes adjustments based on the potential of the output from the amplitude amplification buffer circuit.

Preferably, the size ratio between said transistors comprising said transmission buffer circuit and the size ratio between said transistors comprising said amplitude amplification circuit is roughly the same.

Likewise, the size ratio between said transistors comprising said clock generating circuit, the size ratio between said transistors comprising said transmission buffer circuit, and the size ratio between said transistors comprising said amplitude amplification circuit is roughly the same.

Preferably, the first bias signal makes adjustments at a potential proportional to the output of the clock generating circuit.

Preferably, the first bias signal makes adjustments based on the potentials of the output of the circuits that are provided separately from the transmission buffer circuit and the amplitude amplification buffer circuit respectively and both circuits are similar to the transmission buffer circuit and the amplitude amplification buffer circuit respectively.

With the above configuration, the clock signal amplitude during transmission can be secured and the common-mode voltage can be supplied stably.

According to the present invention, the clock signal amplitude during transmission can be secured, the common-mode voltage can be supplied stably, and clock signal generation, transmission and reception can be operated suitably by circuits configured with the same circuit topology.

BRIEF DESCRIPTION OF THE DRAWINGS

FIG. 1 is a diagram showing an example of a conventional configuration;

FIG. 5 is a diagram showing a configuration of the present invention including a common-mode feedback circuit;

DESCRIPTION OF THE PREFERRED EMBODIMENTS

Hereinafter, the preferred embodiments of the present invention are described in detail based on the diagrams.

First Embodiment

Figures 2A, 2B:
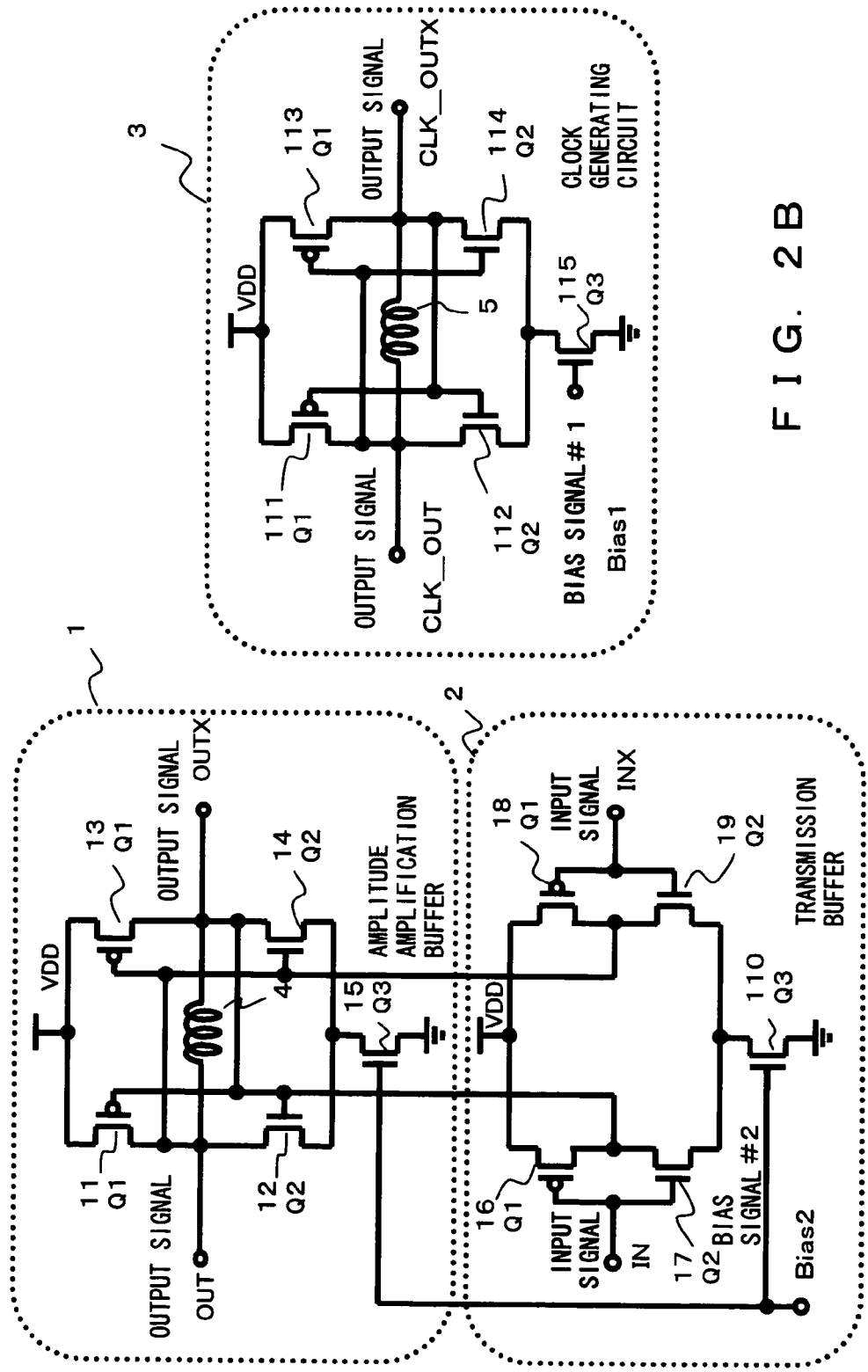
FIG. 2A is a diagram showing a transistor-level embodiment of the amplitude amplification buffer and the transmission buffer.
FIG. 2B is a diagram showing the clock generating circuit.

FIG. 2 shows an example configuration of a clock distribution circuit according to the present invention. FIG. 2A is a diagram showing an amplitude amplification buffer circuit 1 and a transmission buffer circuit 2. FIG. 2B is a diagram showing a clock generating circuit.

The amplitude amplification buffer circuit 1 shown in FIG. 2A is composed of transistors. For example, it comprises a first MOSFET_Q1 (11 and 13), a second MOSFET Q2 (12 and 14), a third MOSFET_Q3 (15) and an inductor 4. Here, the first MOSFET is a P-channel MOSFET (P-channel metal-oxide semiconductor), hereinafter referred to as Q1. In addition, the second and third MOSFETs are N-channel MOSFETs (N-channel metal-oxide semiconductor), hereinafter referred to as Q2 and Q3 respectively.

The sources of Q1_11 and Q1_13 are connected to the power supply (VDD). The drain of Q1_11 and the drain of Q2_12 are connected to the output terminal OUT, as is one terminal of the inductor 4. In addition, the gates of Q1_13 and Q2_14 are also connected to the output terminal OUT.

The drain of Q1_13 and the drain of Q2_14 are connected to the output terminal OUTX, as is the other terminal of the inductor 4. In addition, the gates of Q1_11 and Q2_12 are also connected to the output terminal OUTX.

The drain of Q3_15 is connected to the sources of Q2_12 and Q2_14 and the source of Q13_15 is connected to the ground. A bias terminal (Bias 2) is connected to Q3_15.

Next, the transmission buffer 2 comprises Q1_16 and 18, Q2_17 and 19, and Q3_110. The sources of Q1_16 and Q1_18 are connected to the power supply (VDD). The gate of Q1_16 and the gate of Q2_17 are connected to the input terminal IN. The gate of Q1_18 and the gate of Q2_19 are connected to the input terminal INX.

The drain of Q1_16 and the drain of Q2_17 are interconnected and are also connected to the gates of Q1_11 and Q2_12 of the amplitude amplification buffer 1. In addition, the drain of Q1_18 and the drain of Q2_19 are connected to each other and are also connected to the gates of Q1_13 and Q2_14 of the amplitude amplification buffer 1.

The drain of Q3_110 is connected to the sources for Q2_17 and Q2_19. In addition, the source of Q13_110 is connected to the ground. The bias terminal (Bias 2) is connected to Q3_110.

The clock generating circuit 3 shown in FIG. 2(b) comprises Q1_111 and 113, Q2_112 and 114, and Q3_115.

The sources of Q1_111 and Q1_113 are connected to the power supply (VDD). The drain of Q1_111 and the drain of Q2_112 are connected to the output terminal CLK_OUT, as is one terminal of the inductor 5. In addition, the gates of Q1_113 and Q2_114 are also connected to the output terminal CLK_OUT.

The drain of Q1_113 and the drain of Q2_114 are connected to the output terminal CLK_OUTX, as is the other terminal of the inductor 5. In addition, the gates of Q1_111 and Q2_112 are also connected to the output terminal CLK_OUTX as well.

The drain of Q3_115 is connected to the sources of Q2_112 and Q2_114. In addition, the source of Q13_115 is connected to a ground. A bias terminal (Bias 1) is connected to Q3_115.

Although the circuit described above is a basic circuit, the circuit configurations of the amplitude amplification buffer 1, the transmission buffer 2, and the clock generating circuit 3 are connected based on Q1 (P-channel MOSFET), Q2 (N-channel MOSFET), and Q3 (N-channel MOSFET). MOSFETS are configured as such, based on P-, N-, and N-channels. In other words, here, the same topology refers to transistor configurations such as P, N, and N. The number of transistors having the same conductivity type as the transistors of the transmission buffer having a differing conductivity type and that of the transistors of the amplitude amplification buffer having a differing conductivity type is the same. in other words, the number of N-channel and P-channel transistors in each of the transmission buffer and the amplitude amplification buffer is the same.

Furthermore, bias is controlled by controlling Q3 with a bias signal #2 from the Bias 2 terminal.

Figure 3:
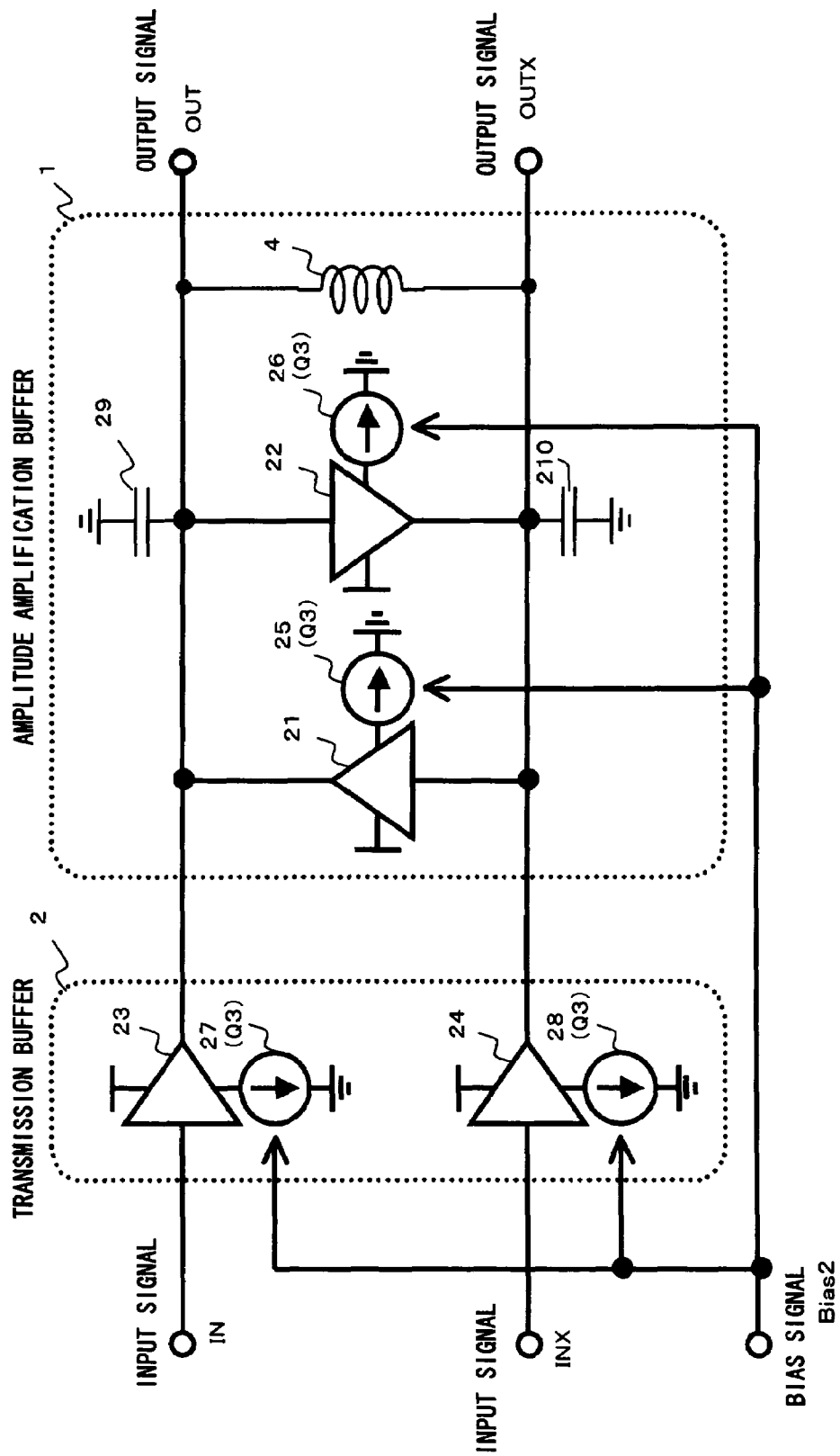
FIG. 3 is a diagram showing the configurations of the amplitude amplification buffer and the transmission buffer of the present invention.

FIG. 3 is a diagram equivalently showing the connections of the amplitude amplification buffer 1 and the transmission buffer 2. The amplitude amplification buffer 1 comprises buffers 21 and 22 and power supplies 25 and 26. Additionally, the transmission buffer 2 comprises buffers 23 and 24 and power supplies 27 and 28.

The buffers 21 to 24 are the P and N topologies described above. In other words, the buffer 21 comprises Q1_13 and Q2_14. In addition, the buffer 22 comprises Q1_11 and Q2_12, the buffer 23 comprises Q1_16 and Q2_17, and the buffer 24 comprises Q1_18 and Q2_19. Furthermore, the power supplies 25 to 28 are Q3 which has been shown equivalently (N-channel MOSFET).

The present invention differs from the conventional method in that the transmission buffer 2 for transmitting the clock signals and the amplitude amplification buffer 1, which is connected thereto in series, are essentially configured with the same circuit topology and controlled by the same bias signal.

For example, configuration can be made such as to be P, N, and N, or P, P, N, and N, using P-channel MOSFETs and N-channel MOSFETs. In addition, if the topology of Q1, Q2, and Q3 which compose the amplitude amplification buffer 1 and the transmission buffer 2 are the same, the size of the MOSFETs is irrelevant. For example, the sizes can differ if the size of the MOSFET comprising the amplitude amplification buffer 1 is Q1=2 µm, Q2=1 µm, and Q3=1 µm, and the size of the MOSFET comprising the transmission buffer 2 is Q1=1 µm, Q2=0.5 µm, and Q3=0.5 µm. However, the size ratio must be the same.

If the size ratios of the MOSFETs are the same, bias signals can be input directly. For example, they can be approximately 2:1:1 and approximately 3:2:2. Here, needless to say, the size ratio does not have to be an integral ratio.

Although this will be described hereafter, the inductance 4 and capacitances 29 and 210 may or may not be connected to the amplitude amplification buffer 1. However, because inductances, capacitances, and resistance components are generated in the connection line, they cannot be eliminated completely. The transmission buffer 2 can be coupled.

In addition, although the use of a MOSFET has been described in this embodiment, as long as the MOSFET is a transistor, it can be a BiCMOS (Bipolar Complementary Metal Oxide Semiconductor) or the like.

With the configuration described above, a clock with a stable common-mode can be distributed by performing clock distribution using a topological configuration, and furthermore, can be provided to the load circuit 76 without reducing amplitude. In addition, more trees can be configured than the conventional tree.

Second Embodiment

Figure 4:
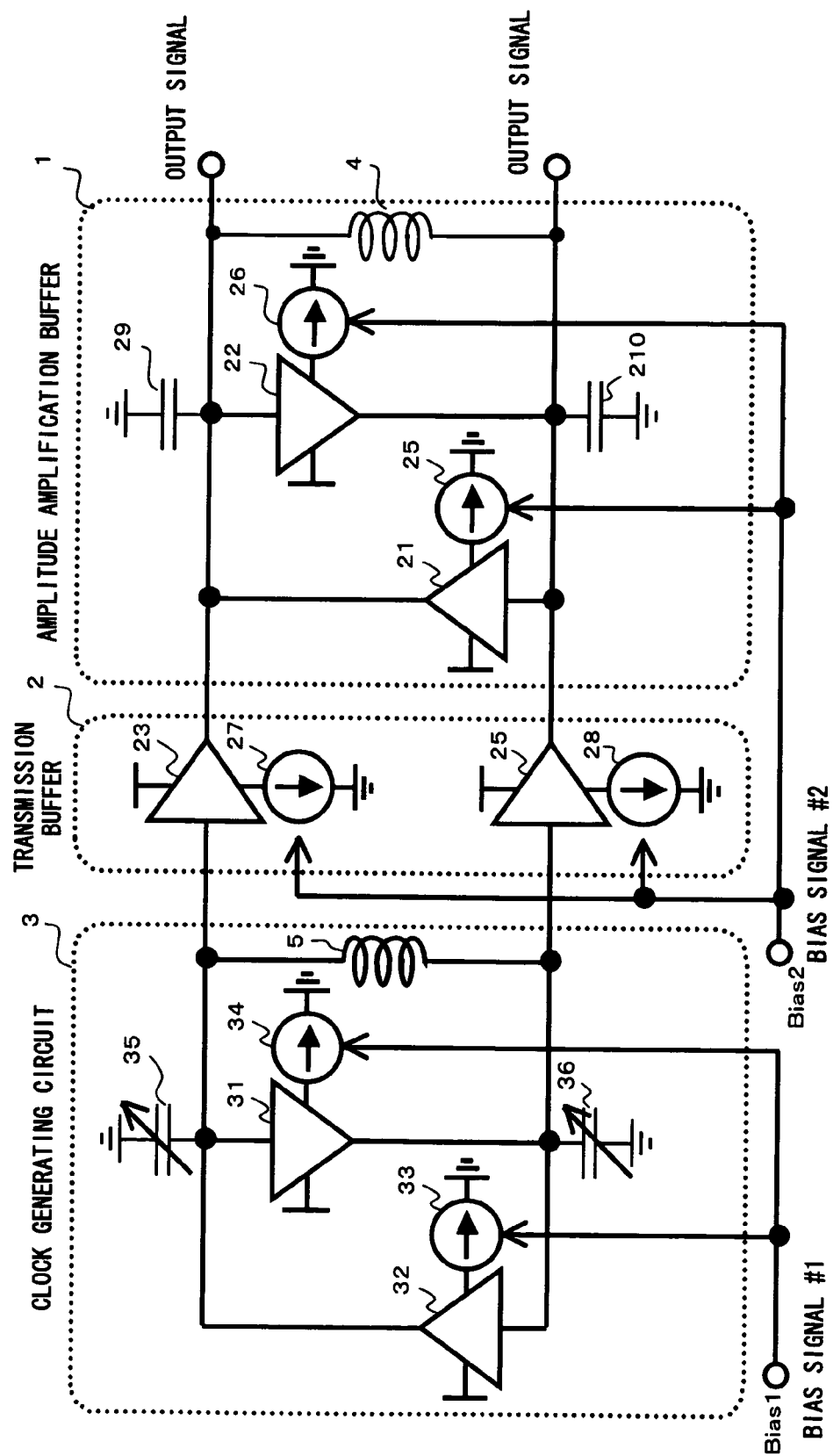
FIG. 4 is a diagram showing the configurations of the amplitude amplification buffer, the transmission buffer, and the clock generating circuit in the present invention.

Furthermore, as shown in FIG. 4, the clock generating circuit 3 can be configured using the same topology as the above-mentioned amplitude amplification buffer 1 and the transmission buffer 2.

A clock generating circuit 3 such as that described in FIG. 2(b) may be employed. The buffer 31 in FIG. 4 comprises Q1_111 and Q2_112 and the buffer 32 comprises Q1_113 and Q2_114. In other words, they are configured with P and N topologies. The power supplies 33 and 34 are Q3_115 shown equivalently.

In addition, although this will be described hereafter, the bias signal #1 for control of the bias in the clock generating circuit 3 does not use the same bias signal as the bias signal #2.

Here, the inductance 5 in the clock generating circuit 3 functions to amplify the amplitude. The capacitances 35 and 36 adjust the clock frequency. The capacitances 35 and 36 can be configured to enable variability.

In addition, the amplitude amplification buffer 1 does not oscillate by not connecting the inductance 4 described in the first embodiment. Furthermore, oscillation can also be suppressed if the value of the inductance 4 is small and the resistance component is large.

Next, if oscillated when the value of the inductance 4 is large and the resistance component is small, the amplitude amplification buffer 1 circuit is configured with essentially the same topology as the clock generating circuit 3 and it shows the same effect as an oscillation circuit as such is inserted within the clock transmission path. In this case, the oscillation frequency and amplitude of the clock generating circuit 3 and the amplitude amplification buffer 1 can be obtained stably by, for example, oscillating the amplitude amplification buffer 1 within a narrow frequency range such as within ±2% of the frequency of the clock generating circuit.

Furthermore, by connecting the capacitances 29 and 210, the oscillation frequency can be adjusted in the same way as the clock generating circuit 3.

In addition, as in the first embodiment, if the topologies of Q1, Q2, and Q3 comprising the amplitude amplification buffer 1, the transmission buffer 2, and the clock generating circuit 3 are the same, the MOSFET sizes are irrelevant. For example, the sizes can differ if the size of the MOSFET comprising the amplitude amplification buffer 1 being Q1=2 μm, Q2=1 μm, and Q3=1 μm, and the transmission buffer 2 being Q1=1 μm, Q2=0.5 cm, and Q3=0.5 μm, and the clock generating circuit 3 being Q1=10 μm, Q2=5 μm, and Q3=5 μm. However, the size ratios must be the same.

If the size ratios are the same, bias signals may be input directly. For example, they can be approximately 2:1:1 and approximately 3:2:2. Here, needless to say, the size ratio does not have to be an integral ratio.

In the above configuration, a clock signal can be provided to the reception circuit with minimal changes to the common-mode voltage and without reducing the amplitude of the large amplitude signal obtained in the clock generating circuit 3, between clock generation and reception. Although the present circuit system has been devised for ultrahigh-speed circuits, which require clock signals of 10 GHz or more, a part of the effects of the present invention can be acquired even in low frequency areas below 10 GHz by adopting a similar configuration.

Third Embodiment

In the circuit according to a third embodiment, as shown in FIG. 5, the bias signal #2 of the circuit according to the second embodiment is generated by a common-mode feedback circuit 41.

Figure 6:
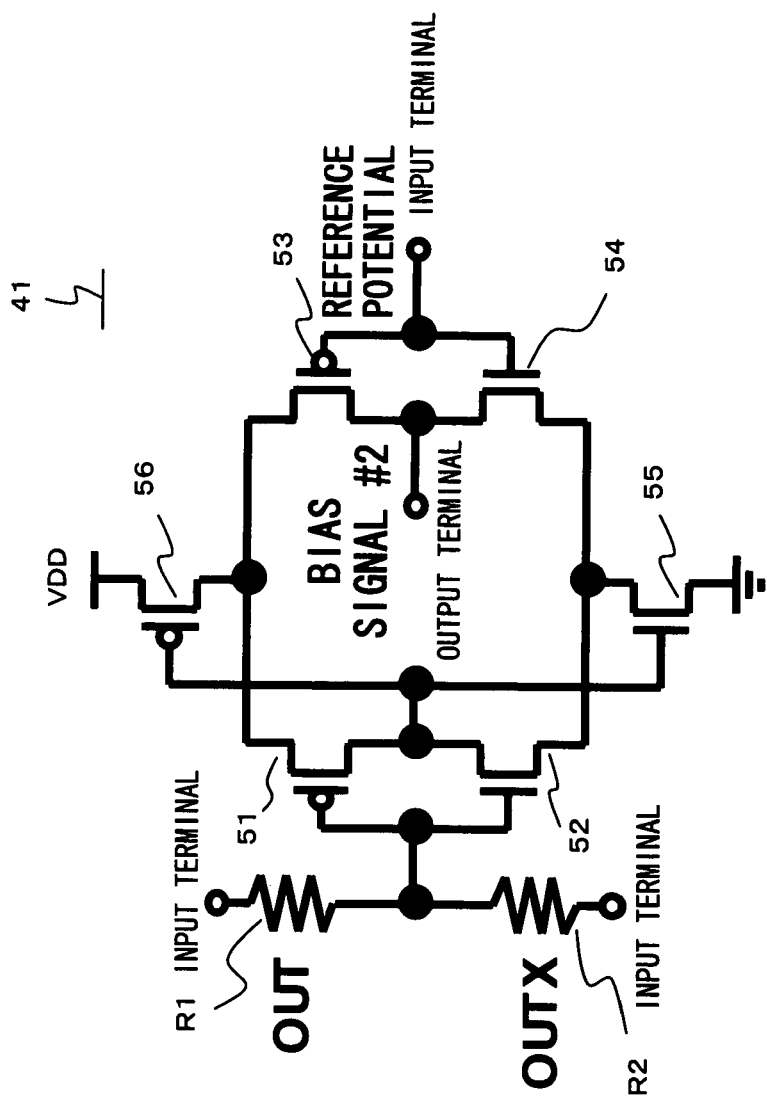
FIG. 6 is a diagram of a transistor-level embodiment of the common-mode feedback circuit.

The common-mode feedback circuit 41 (hereinafter referred to as the CMFB circuit) monitors the common voltage of output terminals OUT and OUTX. The CMFB circuit generates the bias signal #2 when the monitored voltage differs from a reference input voltage. The reference potential can be applied directly from an external source or can be generated in an internal circuit. In addition, although inputted by extending wiring the output terminals OUT and OUTX to the CMFB circuit 41 in the above diagram, the common-mode potential of OUT and OUTX can be generated by other methods, as well. In the CMFB circuit 41 in FIG. 6, the source of P-channel MOSFET 56 is connected to the power supply (VDD).

The gate of P-channel MOSFET 51 and the gate of N-channel MOSFET 52 are connected to the input terminal of the common-mode feedback circuit 41 from the OUT terminal, via resistance R1. Furthermore, one terminal of the resistance R2 is also connected thereto and the other terminal is connected to the OUTX terminal. In addition, the drains of 51 and 52 are connected the gates of N-channel MOSFETs 55 and 56.

The source of 51, the source of 53, and the drain of 56 are connected. In addition, the source of 52, the source of 54, and the drain of 55 are connected. The source of 55 is connected to the ground, and 53 and 54 are connected and connected to an input terminal which inputs reference potential from an external source. The drains of 53 and 54 are connected and the bias signal #2 is output from the output terminal.

Because inverse signals are output to the OUT and OUTX, the resistance values of resistances R1 and R2 are made equal. The voltage level at almost halfway between OUT and OUTX is output to the connection points of R1 and R2. Alternating current components cancel each other out and components close to direct current (low frequency signals) are output. The bias signal #2 is generated by comparing voltage monitored as such and reference voltage input from an external source. The bias signal #2 varies by controlling the gates of 55 and 56 according to the resulting voltage difference between the common voltage of output terminals OUT and OUTX and the reference voltage.

Fourth Embodiment

Figure 7:
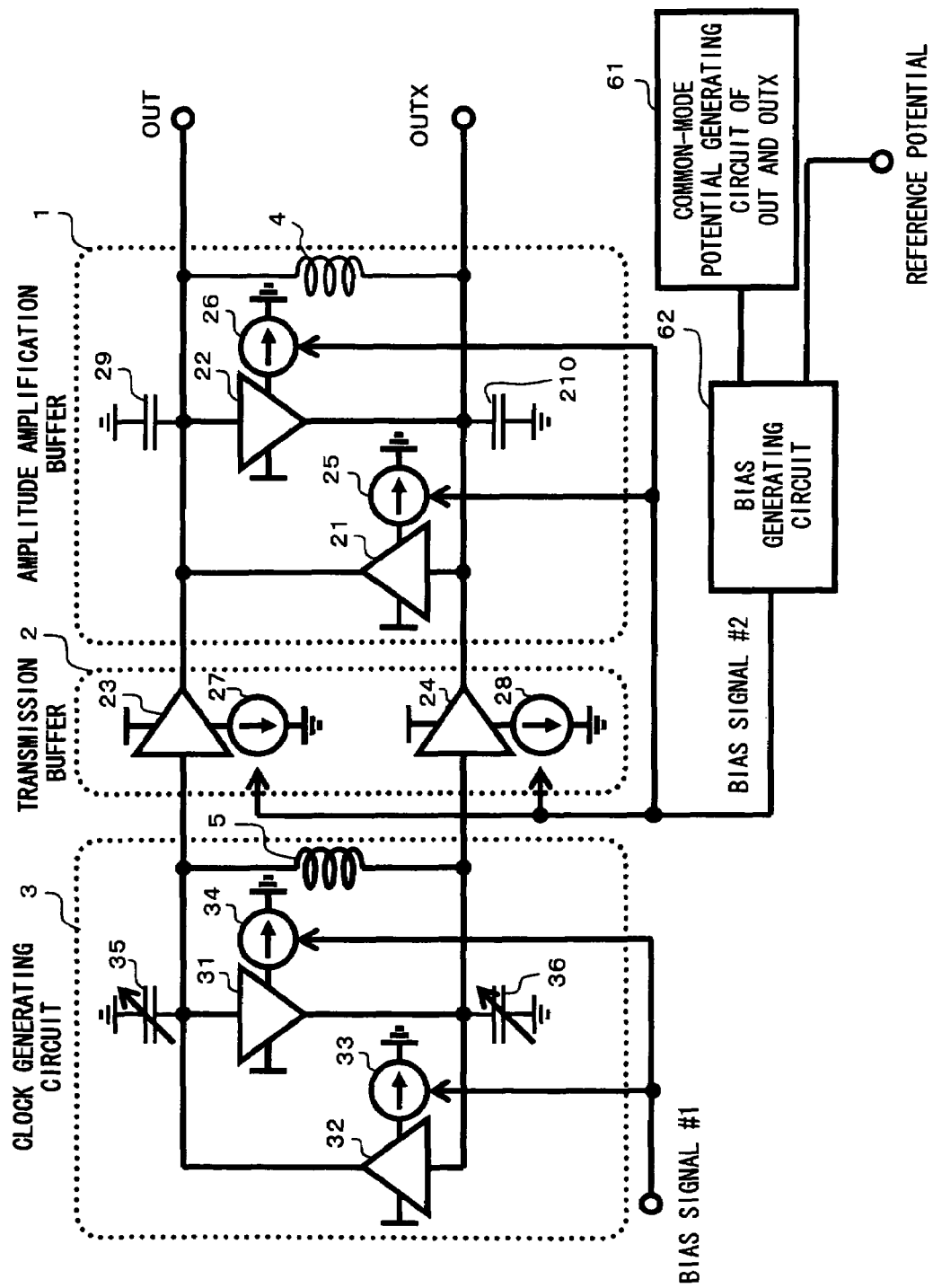
FIG. 7 is a diagram of a configuration when a bias signal is generated in a circuit other than the common-mode feedback circuit.

The circuit of according to a fourth example embodiment is shown in FIG. 7. In this embodiment, the bias signal #2 of the circuit according to the third embodiment is not generated by the common-mode feedback circuit 41. Instead it is generated by a different circuit.

In the present example, the common-mode potential generated by a common-mode potential generating circuit 61 of OUT and OUTX is used to generate the bias signal #2. The common-mode potential is input to a bias generating circuit 62 and inputting a reference voltage from an outside source.

The common-mode potential generating circuit 61 is provided with a separate circuit that has the same configuration as the amplitude amplification buffer 1 and the transmission buffer 2, and the common-mode potential is generated from the output thereof. The bias generating circuit 62 uses a circuit that has a configuration similar to the common-mode feedback circuit 41. However, the circuit is not limited to any particular configuration. Any configuration may be used that permits generation of the appropriate bias signals.

The bias signal #1 of the clock generating circuit 3 can also be generated by the CMFB circuit 41 by providing a separate circuit similar to the clock generating circuit 3. It is also possible to generate the bias signal #1 using the common-mode potential generating circuit 61 and the bias generating circuit 62 in this way.

In addition, the present invention is not limited to the embodiments above and various improvements and modifications may be made without departing from the spirit of the present invention.

What is claimed is:

1. A clock distribution circuit comprising:
    a transmission buffer circuit that transmits a clock signal; and
    an amplitude amplification buffer circuit that amplifies a clock signal with cross-coupling connections inserted in series with the transmission buffer circuit on a transmission path for the clock signal; wherein
    the same number of transistors with the same conductivity type are provided respectively to the transmission buffer circuit comprising the transistors of a differing conductivity type and the amplitude amplification buffer circuit comprising the transistors of a differing conductivity type, at least one transistor in each of the transmission buffer circuit and the amplitude amplification buffer circuit is provided as a bias adjustment transistor, and bias adjustments are made simultaneously,
    wherein said bias adjustment transistor adjusts the bias based on the potential of the output of said amplitude amplification buffer circuit.

2. The clock distribution circuit according to claim 1, wherein the size ratio between said transistors comprising said transmission buffer circuit and the size ratio between said transistors comprising said amplitude amplification circuit is roughly the same.

3. A clock distribution circuit comprising:
a transmission buffer circuit that transmits a clock signal and an amplitude buffer circuit that amplifies a clock signal with cross-coupling connections inserted in series with the transmission buffer circuit on a transmission path that provides the clock signal from a clock generating circuit for generating a clock signal; wherein
the same number of transistors with the same conductivity type are provided respectively to the clock generating circuit comprising the transistors of a differing conductivity type, the transmission buffer circuit comprising the transistors of a differing conductivity type, and the amplitude amplification buffer circuit comprising the transistors of a differing conductivity type;
at least one bias adjustment transistor is provided in each of the clock generating circuit, the transmission buffer circuit, and the amplitude amplification buffer circuit, respectively; and
a first bias signal for performing bias adjustments in the clock generating circuit and a second bias signal for performing bias adjustments in the transmission buffer circuit and the amplitude amplification buffer circuit are provided separately, and bias adjustments are made simultaneously.

4. The clock distribution circuit according to claim 3, wherein said clock generating circuit has an inductance between the output terminals.

5. The clock distribution circuit according to claim 4, wherein said clock generating circuit connects a capacitance between one output terminal and the ground and between the other output terminal and the ground, respectively wherein said clock generating circuit connects a capacitance, located at each output terminal of the clock generating circuit, and the ground.

6. The clock distribution circuit according to claim 3, wherein said amplitude amplification buffer circuit has an inductance between the output terminals.

7. The clock distribution circuit according to claim 6, wherein said amplitude amplification buffer circuit connects a capacitance between one output terminal and the ground and between the other output terminal and the ground, respectively wherein said amplitude amplification buffer circuit connects capacitances, at the output terminals of the clock generating circuit, and the ground.

8. The clock distribution circuit according to claim 3, wherein said first bias signal adjusts the bias based on the potential of the output of a circuit that is provided separately from said clock generating circuit and is similar to said clock generating circuit.

9. The clock distribution circuit according to claim 3, wherein said second bias signal adjusts the bias based on the potential of the output of said amplitude amplification buffer circuit.

10. The clock distribution circuit according to claim 3, wherein the size ratio between said transistors comprising said clock generating circuit, the size ratio between said transistors comprising said transmission buffer circuit, and the size ratio between said transistors comprising said amplitude amplification circuit is roughly the same.

11. The clock distribution circuit according to claim 3, wherein said first bias signal adjusts bias at a potential proportional to the output of said clock generating circuit.

12. The clock distribution circuit according to claim 3, wherein said second bias signal adjusts the bias based on the potential of the output of a circuit provided separately from said transmission buffer circuit and said amplitude amplification buffer circuit and the separately provided circuits are similar to said transmission buffer circuit and said amplitude amplification buffer circuit.

* * * * *